United States Patent [19]
Hilliard et al.

[11] Patent Number: 5,225,668
[45] Date of Patent: Jul. 6, 1993

[54] PHOTONIC ELECTROMAGNETIC FIELD SENSOR APPARATUS

[75] Inventors: Donald P. Hilliard, Oxnard; Dean L. Mensa, Ventura, both of Calif.

[73] Assignee: The United States of America as represented by the Secretary of the Navy, Washington, D.C.

[21] Appl. No.: 932,271

[22] Filed: Aug. 17, 1992

Related U.S. Application Data

[63] Continuation of Ser. No. 710,854, Jun. 6, 1991, abandoned.

[51] Int. Cl.$^5$ .................. H01J 40/14; H01Q 15/08
[52] U.S. Cl. .................. 250/206.2; 343/911 L
[58] Field of Search .......... 359/287, 245, 326, 306, 359/65 H, 529, 642, 522; 250/206, 206.1, 206.2; 343/911 L, 911 R, 754

[56] References Cited

U.S. PATENT DOCUMENTS

| | | | |
|---|---|---|---|
| 3,300,722 | 1/1967 | Iizuka | 343/703 |
| 3,703,723 | 11/1972 | Albanese et al. | 343/911 L |
| 3,949,323 | 4/1976 | Bierlein et al. | 359/326 |
| 4,070,621 | 1/1978 | Bassen et al. | 359/245 |
| 4,287,519 | 9/1981 | Doi | 343/911 L |
| 4,288,337 | 9/1981 | Ota et al. | 343/911 L |
| 4,847,481 | 7/1989 | Altmann | 250/206.1 |
| 5,047,776 | 9/1991 | Baller | 343/911 L |

FOREIGN PATENT DOCUMENTS 0033650 3/1979 Japan .................. 343/911 L

OTHER PUBLICATIONS

CRC Handbook of Chemistry and Physics, 63rd Edition, 1982–1983, p. F-113, Robert C. Weast.

Primary Examiner—Davis L. Willis
Assistant Examiner—Hoa Q. Pham
Attorney, Agent, or Firm—David S. Kalmbaugh; Melvin J. Sliwka

[57] ABSTRACT

An electromagnetic field sensor apparatus which measures the field strength and phase of an incident electromagnetic field as well as the angle of arrival of an incident electromagnetic field. The electromagnetic field sensor apparatus comprises a Luneberg lens which focuses an incoming planar electromagnetic wave entering on one side of the Luneberg lens onto a point on the opposite side of the lens. A photonic sensor is positioned on the Luneberg lens at the point upon which the electromagnetic wave is focused. A light source is located along an optical path which passes through the photonic sensor for transmitting polarized light through the sensor. The photonic sensor modulates the polarized light passing therethrough when the photonic sensor detects the incident electromagnetic wave. A photodetector located along the optical path detects the modulated light as it exists from the photonic sensor. In this manner incident electromagnetic fields may be detected and measured without having scattered fields effect the measurement.

3 Claims, 3 Drawing Sheets

PHOTONIC ELECTROMAGNETIC FIELD SENSOR APPARATUS

This application is a continuation of application Ser. No. 07/710,854, filed Jun. 6, 1991, now abandoned.

BACKGROUND OF THE INVENTION

1. Field of the Invention

The present invention relates generally to electromagnetic field measuring devices and more particularly to an instrument which utilizes a Luneberg lens for the measurement of electromagnetic field energy.

2. Description of the Prior Art

There is a currently a need for an apparatus which will measure incoming planar electromagnetic wave fronts. Such an apparatus should have the capability of detecting radar and communications signals as well as determining the angle of arrival of any incoming planar electromagnetic wave front without the scattering of the wave front which is normally associated with conventional electromagnetic field sensing apparatus.

The detection and measurement of electromagnetic field radiation which may pose a biological threat to mankind has also become increasingly important in view of the rapid proliferation of electronic appliances such as microwave ovens, radar systems, medical apparatus such as diathermy equipment and the like. Both state and federal agencies have promulgated criteria for maximum electromagnetic radiation exposure in the vicinity of commercial and military radar equipment and microwave appliances. Accurate monitoring of fields emitted from such appliances and radar equipment requires that the introduction of the monitoring device into the vicinity of the microwave appliance or radar equipment will not result in significant perturbations of the electromagnetic field to be measured and a resultant loading of the radiation source. Furthermore, the relatively small permissible radiation exposure safety levels require a monitoring device that is capable of accurately measuring small field strengths.

Prior art electromagnetic field sensing devices have utilized metallic cables which tend to perturb the field being monitored thus reducing the accuracy of the resulting measurements. Prior art electromagnetic field sensing devices have also utilized a metallic antenna attached to a conducting transmission line, for example a coaxial cable, which electrically couples the antenna to a receiver unit. However, this prior art sensing device has the disadvantage that the conducting transmission is subject to line losses which limits the length of the cable to a few meters for the measurement of microwave measurements. In addition, the antenna and the transmission line of this prior art sensing device develop surface currents which are induced by the incident electromagnetic fields being sensed, thereby creating scattered electromagnetic fields. These scattered electromagnetic fields disturb the incident electromagnetic fields being sensed reducing the accuracy of the electromagnetic field measurements. Further these scattered electromagnetic fields provide a signature for enemy detectors in a hostile environment.

A more recent field measurement system employs diode detectors connected to an antenna to detect electromagnetic radiation. The diode detector employs a high-ohmic transmission line to transfer the detected signal to a readout device which allows extraneous noise to be picked up by the antenna. The bandwidth of the information transmitted on the high-ohmic transmission line is quite small, precluding the observation of short electromagnetic pulses or rapid modulation of the fields under study. Light emitting diodes connected to an antenna are impractical for the measurement of fields whose strengths even approach the small magnitude required to enforce the maximum radiation exposure criteria. The prior art light emitting diode is an active device, drawing its power from the field being monitored. Approximately 1.3 volts must be applied to the light emitting diode before any light is emitted whatsoever. However, only a few millivolts of radio-frequency or microwave energy are available from an electrically small, non-perturbing antenna in the presence of an electric field whose intensity is strong enough to just exceed the radiation exposure hazard criteria for RF or microwave appliances. In addition, the prior art light emitting diode device distorts the instantaneous signal which is received by the antenna to which it is connected, thereby reducing the accuracy of the measurement of the amplitude, phase and frequency thereof.

A need therefore exists for an electromagnetic field sensing apparatus which provides a long-sought solution to the problem of accurately measuring potentially hazardous electromagnetic radiation to confirm safe exposure criteria. There is also a need for a low scattering electromagnetic field sensing apparatus which will monitor radar and communications signals as well as measure electromagnetic fields on board ships, in anechoic chambers and like environments.

SUMMARY OF THE INVENTION

The purpose of the present invention is to provide an electromagnetic field sensor apparatus which measures the field strength and phase of an incident electromagnetic field as well as the angle of arrival of an incident electromagnetic field. The present invention includes a Luneberg lens which focuses an incoming planar electromagnetic wave entering on one side of the Luneberg lens onto a point on the opposite side of the lens. A photonic sensor which may be a Pockel cell is positioned on the Luneberg lens at the point upon which the electromagnetic wave is focused. A light source is located along an optical path which passes through the photonic sensor for transmitting polarized light through the sensor. The photonic sensor modulates the polarized light passing therethrough when the photonic sensor detects the incident electromagnetic wave. A photodetector located along the optical path detects the modulated light as it exists from the photonic sensor. In this manner incident planar wave electromagnetic fields may be detected and measured without having scattered fields effect the measurement due to the lack of a metallic antenna and metallic wires/conductors which are normally attached to the antenna as in conventional electromagnetic field measurement devices. In the present invention a polarization preserving optical fiber may be used to transmit the polarized light from the source to the photonic sensor. In addition, multiple sensors may be positioned on the outer surface of the Luneberg lens to allow for the measurement of the angle of arrival of an incoming planar electromagnetic wave.

It is therefore an object of the invention to monitor electromagnetic radiation in free space or in the near field of a radiating source in an improved manner.

It is a further object of the invention to monitor electromagnetic radiation having a small field strength in an improved manner.

It is another object of the invention to provide an apparatus which measures the angle of arrival of an incident electromagnetic field.

It is still another object of the invention to measure the electromagnetic field strength in amplitude and phase of incident electric and magnetic fields.

It is yet another object of the invention to monitor electromagnetic fields while causing negligible scattering of the fields being monitored.

It is yet a further object of the invention to provide an apparatus which allows measurement of the polarization of incident electromagnetic fields.

Still further objects, advantages and novel features of the present invention will become apparent from the following detailed description of the invention when considered in conjunction with the drawings.

DETAILED DESCRIPTION OF THE PREFERRED EMBODIMENT

The preferred embodiment of the present invention will now be discussed in conjunction with all of the figures of the drawings.

Figure 1:
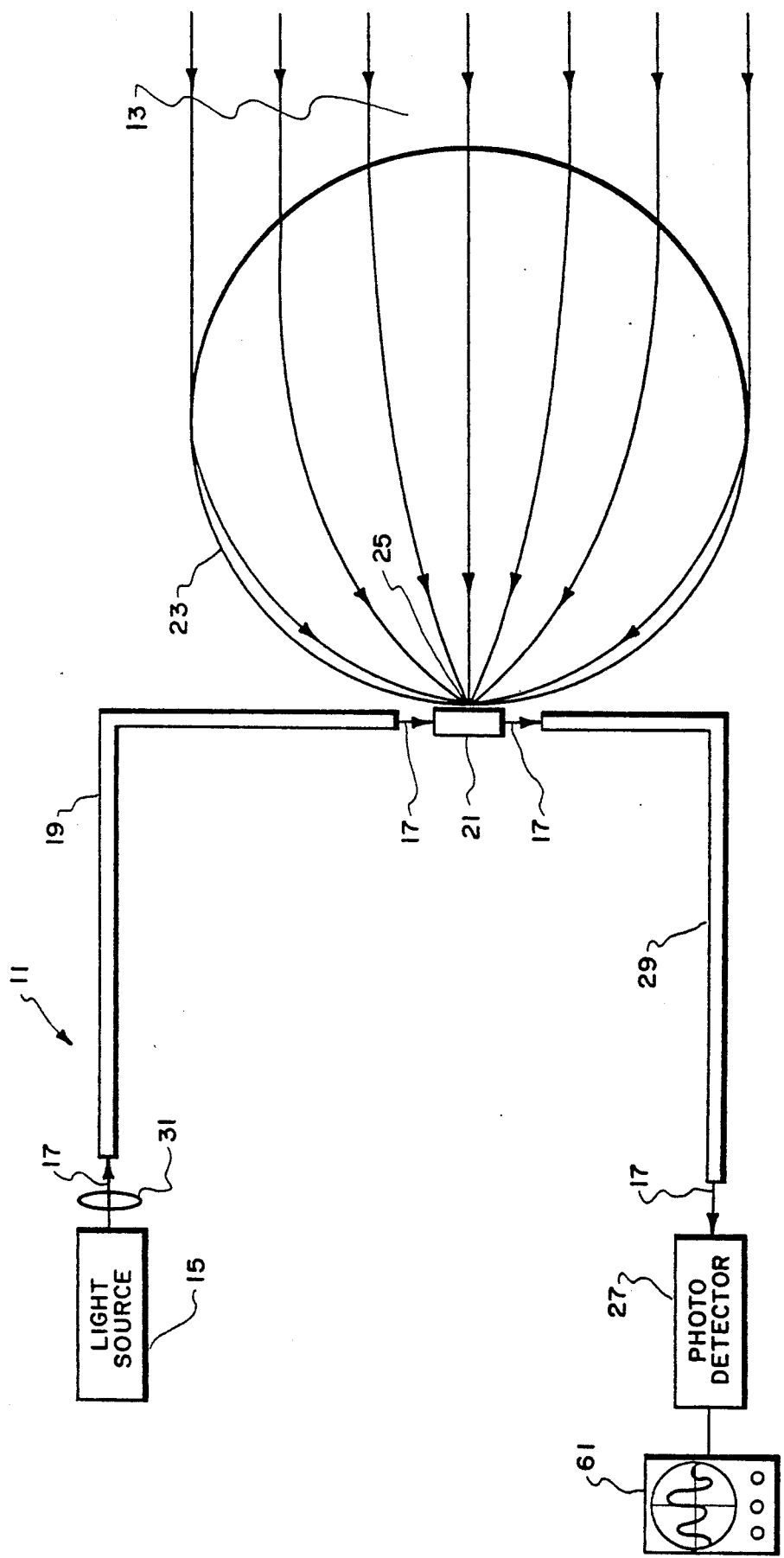
FIG. 1 is a schematic view illustrating the basic elements of the photonic electromagnetic field sensor apparatus constituting the present invention.

Referring now to all of the drawings and in particular to FIG. 1, the basic elements necessary for the operation of the present invention are shown. FIG. 1 shows a photonic electromagnetic field sensor apparatus 11 in free space which operates with negligible perturbation upon an incident planar electromagnetic field 13. The apparatus 11 of the present invention comprises a light source 15 positioned along an optical path 17 for transmitting a monochromatic beam of laser light along optical path 17 through a polarization maintaining optical fiber 19 to a photonic sensor 21. Photonic sensor 21 is positioned on the outer surface of Luneberg lens 23 at a focal point 25 and will modulate light entering the sensor 21 along optical path 17 when electromagnetic field 13 is incident on sensor 21 at point 25. In the preferred embodiment of the present invention photonic sensor 21 may be a Pockel cell which is 15 an electro-optic crystal having the property of variable birefringence.

There is positioned along optical path 17 down stream from sensor 21 a photo-detector 27 for detecting the modulated light as it traverses the sensor 21 and then exits from sensor 21 through an optical fiber 29 positioned on path 17 to photo-detector 27. In operation photonic sensor 21 detects weak electromagnetic fields while imposing a negligible perturbation thereon.

Also shown in FIG. 1 is a polarizer 31 located along optical path 17 between the light source 15 and the polarization maintaining optical fiber 19. Polarizer 31 polarizes the light provided by source 15 and then transmitted through fiber 19 to sensor 21.

The light source 15 used in the preferred embodiment of the present invention may be any conventional light source, but preferably is a source of monochromatic laser light having a wavelength of approximately 1.3 microns so that the monochromatic laser light may be transmitted through polarization maintaining optical fiber 19 which efficiently transmits light having a wavelength of approximately 1.3 microns. A preferred light source is a Neodymium YAG laser which operates at a wavelength of 1.32 microns and is manufactured by Schwartz Electro-Optics Inc. of Orlando, Fla.

The theory of electro-optic modulation has been extensively discussed in the literature, for example F. S. Chen, "Modulators for Optical Communications", proceedings IEEE, Vol. 58 No. 10, October 1970, pages 1440–1457 and "Optical Waves in Crystals, Propagation and Control of Laser Radiation" by Amnon Yariv and Pochi Yeh. The literature discusses the electro-optic properties of a number of different materials and modulator configurations employing electro-optic crystals. Suitable electro-optic materials for the composition of photonic sensor 21 may be selected from the group consisting of $LiNbO_3$, $LiTaO_3KD_2PO_4(DKDP)$, $Ba_2NaNb_5O_{15}$, $Sr_{0.25}Ba_{0.75}Nb_2O_6$ and $BaTiO_3$. There are also organic polymer materials such as those made by Hoest Celanese Corporation that exhibit the Pockel's effect and thus may be used as photonic sensor 21.

Photonic sensors exhibit a property identified as Pockel's linear electro-optic effect which means that the index of refraction of electro-optic materials such as lithium niobite and lithium tantalate changes proportionally to the strength of an electric field being measured with this change being generally exhibited over a frequency range of from 1 hertz to 1000 GHz. It is well known that the 1 hertz to 1000 GHZ frequency range of the electromagnetic spectrum consists of microwaves, radio frequency waves, telephone signals and audio signals. The response of these materials to the electric field being measured is directly proportional to a factor known as the electro-optic coefficient which has the units of meters/volt, is a tensor quantity and is typically, but not always, large in the direction of one axis of the electro-optic material and weak in the remaining two axis of the material. When laser light is passed through the electro-optic material it is modulated by the changing index of refraction of the material in proportion to the strength/intensity of the electric field being measured. The laser light passing through the electro-optic material may then be measured by detector means such as photo-detector 27.

Figure 2:
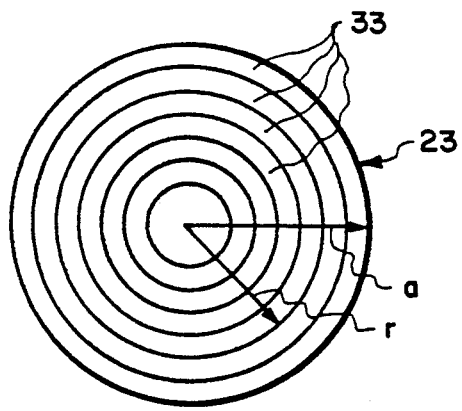
FIG. 2 is a schematic view illustrating the Luneberg lens used in the preferred embodiment of the present invention.

These electro-optic materials also have the common property that they enter a state of variable birefringence which is which is proportional to the magnitude of the field strength imposed across the crystal. When polarized laser light propagates through the crystal, it undergoes a rotation in a direction of polarization which is proportional to the distance traversed in the crystal and the magnitude of the birefringent state. By polarizing laser light prior to entry into a crystal and analyzing the polarized laser light after the light propagates through the crystal and undergoes a rotation of its polarization direction, by means of a polarizing analyzer apparatus, the extent of the rotation of the plane of polarization due the birefringent state can be measured. The use of a polarizing analyzer apparatus to measure the extent of rotation of the plane of polarization after polarized laser light propagates through a crystal is thoroughly discussed in U.S. Pat. No. 4,070,621, issued Jan. 24, 1978 to Howard I. Basen and Richard Peterson. U.S. Pat. No. 4,070,621 also discloses signal processing circuitry which may be used with a photodetector, such as photo-detector 27, and which will measure the amplitude, phase and frequency of an incident electromagnetic field Referring now to FIG. 2 there is shown the Luneberg lens 23 used in the preferred embodiment of the present invention. The Luneberg lens is fabricated by stacking concentric shells 33 of polystyrene material with the dielectric constant of each shell 33 given by the following expression:

$$\epsilon_r[r] = 2 - [r/a]^2 \qquad (1)$$

where a is the radius of the lens, r is the radial distance from the center of the lens, and $\epsilon_r[r]$ is the relative permittivity of Luneberg Lens 23 which varies as a function of distance from the center of the lens having a maximum value of two at the center of the lens and a minimum value of one at the radius a of lens 23. Because of the low permittivity of polystyrene, the Luneberg lens 23 used in the preferred embodiment of the present invention will not generate scattered electromagnetic fields which limits the accuracy of the measurements provided by photonic electromagnetic field sensor apparatus 11.

Figure 3A:
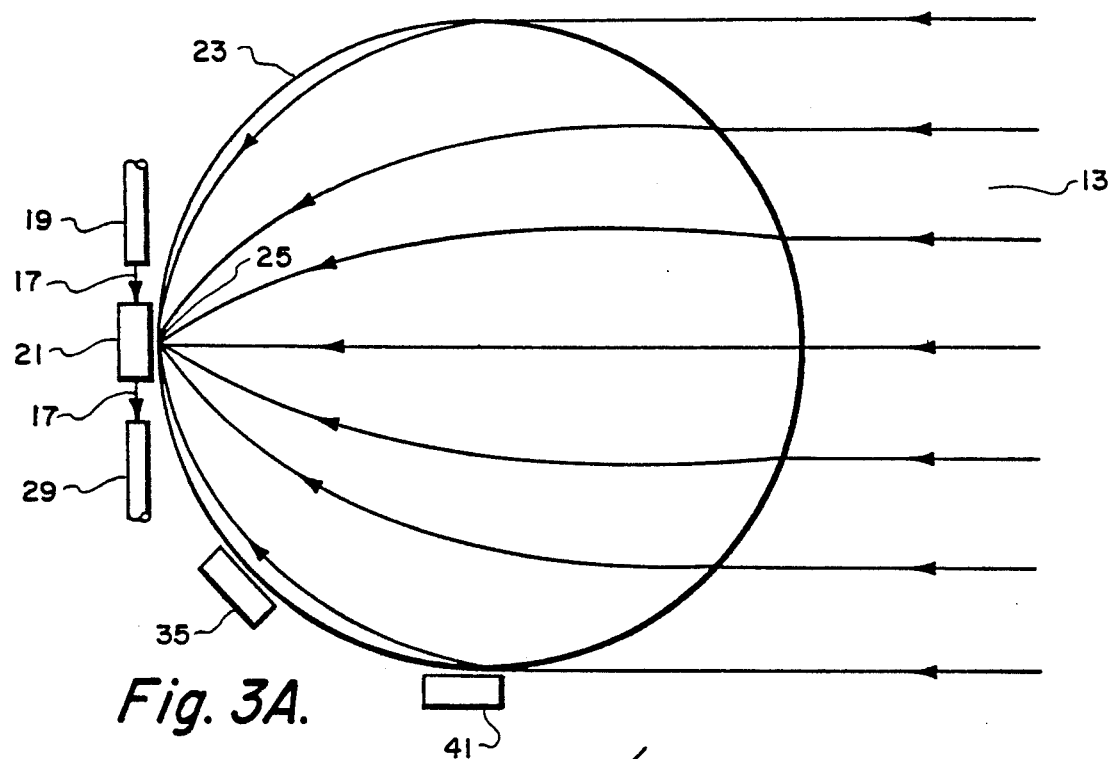
FIG. 3(A) thru 3(B) illustrate planar electromagnetic wave fronts incident on the Luneberg lens of the present invention at different angles of arrival.
Figure 3B:
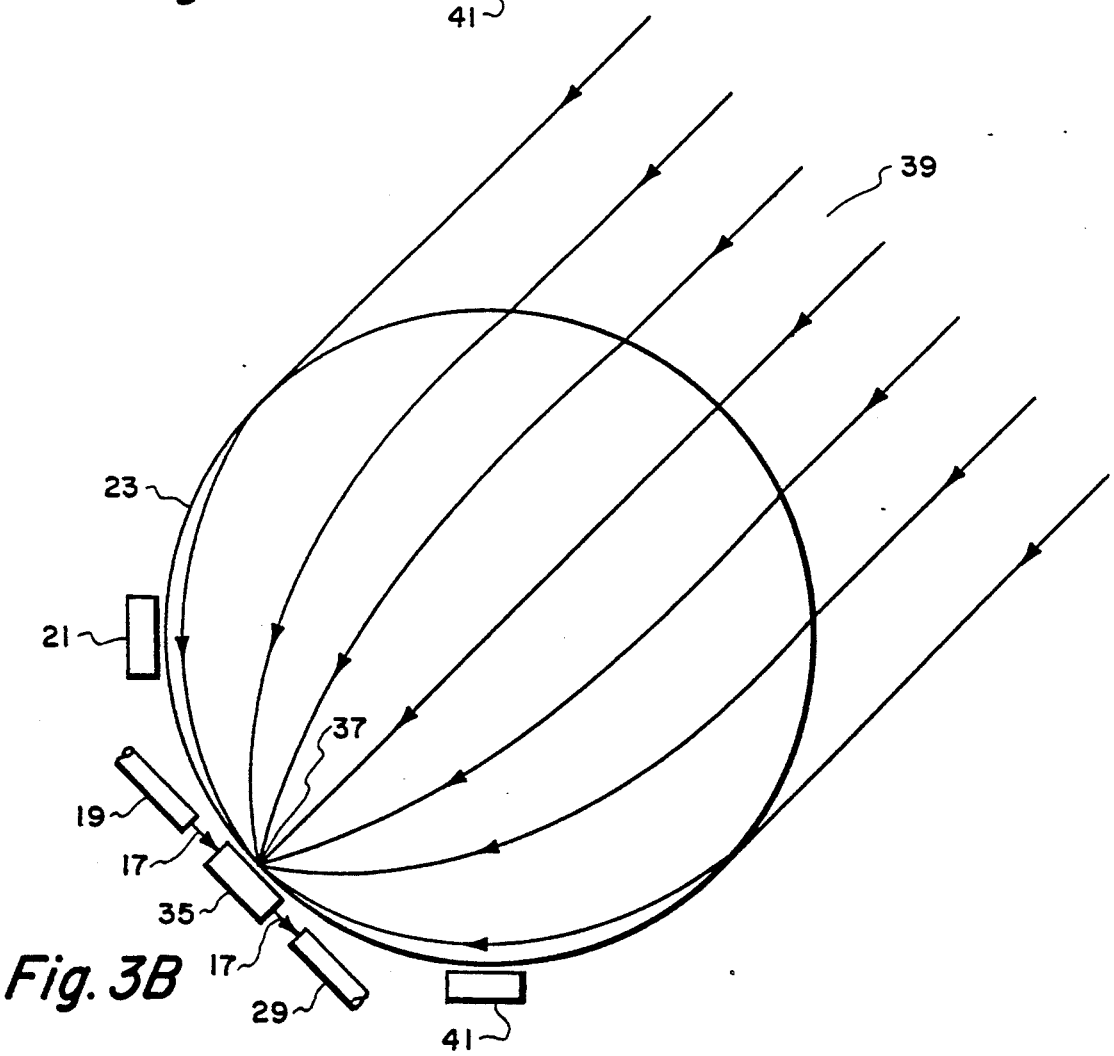

Referring now to FIGS. 1 and 3, there is shown Luneberg lens 23 having photonic sensor 21 positioned on the outer surface of lens 23 at the focal point 25 of incident planer electromagnetic wave 13. Application of electromagnetic field 13 to sensor 21 modulates laser light propagating through sensor 21 along optical path 17 with the degree of modulation of the laser light being in direct proportion to field 13 and thus the strength of field 13 being measured by photo-detector 27. Likewise, a photonic sensor 35 may be positioned on the outer surface of Luneberg lens 23 at a focal point 3 which is approximately forty five degrees in the counterclockwise direction from sensor 21. A planar electromagnetic wave 39 incident upon Luneberg lens 23 at angle of forty five degrees from the vertical plane will be focused on sensor 35 as is best illustrated by FIG. 3(B) with sensor 35 modulating laser light propagating therethrough so that a second photo-detector, not illustrated, may measure the strength of electromagnetic plane wave 39. A third photonic sensor 41 may positioned on the outer surface of Luneberg lens 23 ninety degrees in a counterclockwise direction from sensor 21. Sensor 41 will, in turn, allow photonic electromagnetic field sensor apparatus 11 to measure the strength/intensity of a planar electromagnetic wave incident on Luneberg lens 23 in a horizontal plane. It should be understood that each sensor 21, 35 and 41 has a separate measuring device, that is a separate photo-detector, for measuring the strength/intensity of an incoming electromagnetic field, thus allowing photonic electromagnetic field sensor apparatus 11 to distinguish between different electromagnetic planar wave fronts.

Figure 4A:
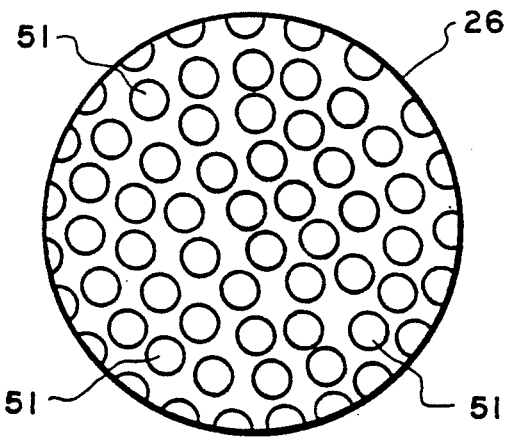
FIG. 4(A) thru 4(C) illustrate a Luneberg lens having a plurality of photonic sensors.

Referring now to FIG. 4, photonic sensors may be positioned at a plurality of locations on the outer surface of a Luneberg lens 26 to measure the intensity of any planar electromagnetic wave incident on Luneberg lens 26 irregardless of the angle of arrival of the wave. In addition, by positioning photonic sensors around the outer surface of Luneberg lens 26 in the manner illustrated by FIG. 4, the angle of arrival of any incoming planar electromagnetic wave may be measured by apparatus 11 since Luneberg lens 26 will focus the incoming wave on a particular focal point thereby focusing the wave on the photonic sensor positioned at that particular focal point. For example, the Luneberg lens of the present invention will focus a planar electromagnetic wave 39 arriving at an angle of forty five degrees on photonic sensor 35, FIG. 3(B) which will, in turn, result in only laser light propagating through sensor 35 being modulated by sensor 35. By utilizing a photonic detector of the type illustrated in FIG. 5 for receiving the modulated light signal from sensor 35 and then provides an electrical signal having an amplitude that varies as function of the amplitude and phase of the incident wave 39. The angle of arrival of wave 39 may be determined directly by noting the response of the corresponding photo-detector measuring light modulated by sensor 35.

Figure 4B:
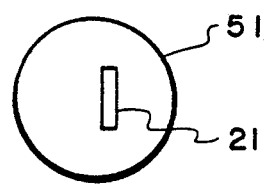
Figure 4C:
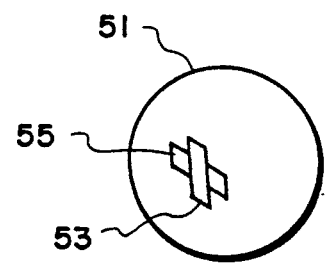

Referring again to FIG. 4, there is shown Luneberg lens 26 having a plurality of photonic sensor elements 51 which may be a conventional photonic sensor 21 as is best illustrated in FIG. 1 and FIG. 4(B), or a photonic sensor having large electro-optic coefficients in the two axis that are tangent to the surface of the lens, or two separate single photonic sensors 53 and 55 with large electro-optic coefficients in a single axis positioned orthogonal to each other and tangent to the surface of lens 26. As shown in FIG. 4(c), either configuration will enable the sensing of any arbitrarily polarized electromagnetic field incident on Luneberg lens 26. The specific polarization of the incident, electromagnetic field may be determined by means of a conventional polarization analyzer apparatus.

Figure 5:
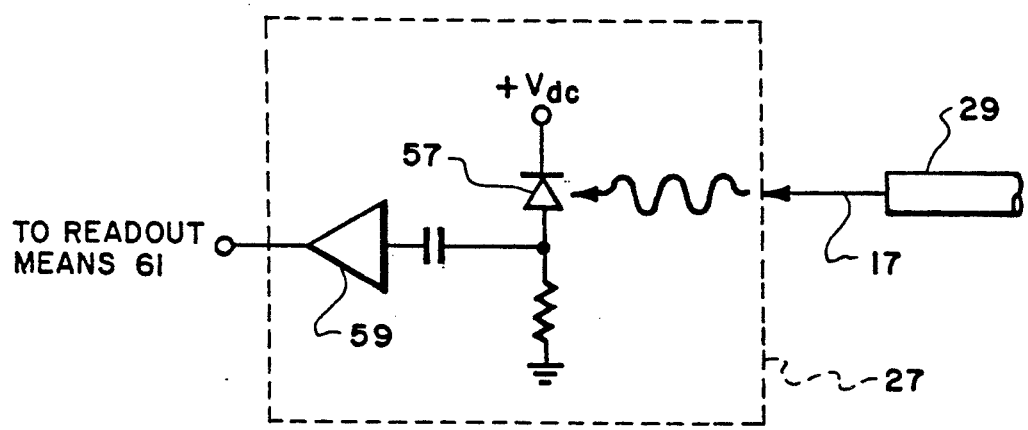
FIG. 5 is an electrical schematic diagram for the photo-detector used in the preferred embodiment of the present invention.

Referring now to FIG. 5, there is shown an electrical schematic of photo-detector 27 which includes a photodiode 57 for receiving the modulated laser light from sensor 21 and providing an electrical signal in response to the modulated light signal having an amplitude that varies in response to the degree of modulation of the laser light by response to the degree of modulation of the laser light by sensor 21. The electrical signal is then amplified by a low noise amplifier 59 and supplied to conventional readout means 61 such as an oscilloscope which provides a visual indication of the intensity of the incoming electromagnetic wave 13.

From the foregoing, it may readily be seen that the subject invention comprises a new, unique and exceedingly useful photonic electromagnetic field sensor apparatus which constitutes a considerable improvement over the known prior art. Obviously many modifications and variations of the present invention are possible in light of the above teachings. It is therefore to be understood that within the scope of the appended claims the invention may be practiced otherwise than as specifically described.

What is claimed is:

1. An electromagnetic field sensor apparatus for measuring the intensity and the angle of arrival of an incoming planar electromagnetic wave comprising:

a plurality of electro-optic crystals, each of said electro-optic crystals having first and second surfaces intersecting an optical path and a third surface;

a light source for transmitting monochromatic light along each of said optical paths into each of said electro-optic crystals through the first surface thereof;

a polarizer positioned along each of said optical paths between said light source and each of said electro-optic crystals for polarizing monochromatic light transmitted from said light source into said electro-optic crystals through the first surface thereof;

a plurality of first optical fibers, one of said first optical fibers being positioned along each of said optical paths between said polarizer and one of said electro-optic crystals for maintaining the polarization of said monochromatic light as said monochromatic light is transmitted from said polarizer to said electro-optic crystal;

a Luneberg lens having said electro-optic crystals positioned on the outer surface and covering the entire outer surface of said Luneberg lens so as to allow the field of view of said Luneberg lens to be four $\pi$ steradians, said Luneberg lens intercepting said planar electromagnetic wave and focusing said intercepted planar electromagnetic wave upon the third surface of one of said electro-optic crystals;

said plurality of electro-optic crystals being positioned on and covering the entire outer surface of said Luneberg lens so as to allow for the measurement of the intensity and the angle of arrival of said intercepted planar electromagnetic wave irrespective of the angle of arrival of said intercepted planar electromagnetic wave;

said electro-optic crystal upon which said planar electromagnetic wave is focused by said Luneberg lens modulating the monochromatic light as it transverses said electro-optic crystal;

said electro-optic crystal upon which said intercepted planar electromagnetic wave is focused modulating said monochromatic light only when the frequency of said intercepted planar electromagnetic wave is within the microwave frequency range of the electromagnetic spectrum;

a plurality of detectors, each of said detectors being positioned along one of said optical paths downstream from one of said electro-optic crystals for detecting modulated monochromatic light exiting from the second surface of said electro-optic crystal upon which said planar electromagnetic wave is focused and providing an electrical signal indicative of the intensity of said planar electromagnetic wave; and a plurality of second optical fibers, one of said second optical fibers being positioned along each of said optical paths between one of said electro-optic crystals and one of said detectors for transmitting modulated monochromatic light exiting from said electro-optic crystal to said detector.

2. The electromagnetic field sensor apparatus of claim 1 wherein said electro-optic crystal is a Pockel cell.

3. The electromagnetic field sensor apparatus for claim 1 further characterized by readout means electrically coupled to said detector for receiving the electrical signal provided by said detector and for providing a visual indication of the intensity of said intercepted planar electromagnetic wave.

* * * * *